United States Patent
Jacques et al.

(10) Patent No.: US 6,872,961 B2
(45) Date of Patent: Mar. 29, 2005

(54) VIBRATION CONTROL UTILIZING SIGNAL DETRENDING

(75) Inventors: Robert N. Jacques, Boston, MA (US); David J. Warkentin, Boston, MA (US)

(73) Assignee: Cymer, Inc., San Diego, CA (US)

(*) Notice: Subject to any disclaimer, the term of this patent is extended or adjusted under 35 U.S.C. 154(b) by 476 days.

(21) Appl. No.: 10/112,443

(22) Filed: Mar. 29, 2002

(65) Prior Publication Data

US 2003/0041447 A1 Mar. 6, 2003

Related U.S. Application Data (63) Continuation-in-part of application No. 10/074,059, filed on Feb. 11, 2002, now Pat. No. 6,563,128, and a continuation-in-part of application No. 09/491,969, filed on Jan. 27, 2000.

(51) Int. Cl.[7] .................. G01N 21/86; F16M 13/00
(52) U.S. Cl. .................................. 250/548; 248/550
(58) Field of Search .................. 250/548; 248/550, 248/638; 355/53, 55; 356/399–401; 73/662, 663, 664

(56) References Cited

U.S. PATENT DOCUMENTS

| | | | | |
|---|---|---|---|---|
| RE33,937 E | * | 5/1992 | Schubert | 267/136 |
| 5,811,821 A | * | 9/1998 | Alexander et al. | 250/440.11 |
| 6,036,162 A | | 3/2000 | Hayashi | 248/550 |
| 6,522,388 B1 | * | 2/2003 | Takahashi et al. | 355/53 |
| 6,563,128 B2 | * | 5/2003 | Lublin et al. | 250/548 |

FOREIGN PATENT DOCUMENTS

WO    WO 02/069461    2/2002

* cited by examiner

*Primary Examiner*—Stephone B. Allen
(74) *Attorney, Agent, or Firm*—William Cray (57) ABSTRACT

A motion control system for reducing vibration in moving components. The system includes a position control drive and a vibration control drive. At least one position sensor is used to provide feedback signals which are in turn used to provide control signals for both the position control drive and the vibration control drive. In a preferred embodiment the motion control system is applied to a stage of an integrated circuit lithography step and scan machine. The position control drives are linear magnetic actuators and the vibration control drives are electroceramic actuators. A laser interferometer position monitoring system is used to measure the position, speed, and acceleration of the stage system. Actuators apply controlled forces (based on measurements from the position monitoring system) to each stage to control the motion of the stage. Signals from the interferometer position system are also used to control vibration. A recursive least squares (RLS) method is used to identify the commanded motion from the laser interferometer signals. Vibration measurements are derived from the laser interferometer signals by removing the commanded motion portion of the signal.

11 Claims, 12 Drawing Sheets

VIBRATION CONTROL UTILIZING SIGNAL DETRENDING

This application is a continuation-in-part of Ser. No. 09/491,969, filed Jan. 27, 2000 and a continuation-in-part of Ser. No. 10/074,059, filed Feb. 11, 2002 now U.S. Pat. No. 6,563,128.

FIELD OF THE INVENTION

The invention relates generally to motion control systems and in particular to such systems having provisions for minimizing degrading vibration.

BACKGROUND OF THE INVENTION

The ability to accurately control motion of a structure in three-dimensional space, or to control motion of one structure relative to another structure in a given space, poses problems of significant technological and economic consequence to many manufacturing applications, such as those used to fabricate semiconductor chips, printed circuit boards, liquid crystal displays, and thin film devices. These operations employ specialized structures (such as reticle and wafer stages in lithography machines, metrology stages, pick-and-place equipment, wafer-handling robots, gantry/head assemblies, linear motors, photoimaging systems, and etching systems) to manufacture and inspect these often-delicate and sensitive products.

A wafer stage supports a silicone wafer on which integrated circuits are printed at several locations called sie spots. A reticle stage supports a reticle (or mask) which is a master image of one layer of the integrated circuit that is to be created. A laser beam is used to illuminate the reticle. The illumination of the reticle results in an image that is directed on to the die spot of the silicon wafer. The wafer is coated with a photoresist that reacts with the illuminated image such that an image is created on the wafer. Subsequent processing of the wafer creates the circuitry (e.g. conductive traces) of the chip. Typically, a reticle contains a plurality of identical images. Multiple images are created on a wafer in a given processing cycle to create multiple chips on a single wafer. Precise control is required during these steps to ensure that each layer of the chip is accurately aligned relative to each other layer. The reticle and the wafer are each moved in opposite direction (scanned) during the illumination of each layer of each die image. A laser interferometer positioning system is often used to measure the position, velocity, and acceleration of the stage. In this machine after the illumination of a die layer (one layer of a chip) on a wafer, the wafer is moved (scanned) by the wafer stage in a particular direction and the reticle stage is moved in the opposite direction so that an adjacent die spot on the wafer can be illuminated. Thus, the process is simetimes referred to as a step and seam process. The process is repeated until all the spots on the wafer have been illuminated. Voice coil motors or linear magnetic actuators are often used to rapidly position the stages that support the semiconductor wafer and the reticle. For additional background information on these step and scan machines see Levinson, H. J.; Principles of Lithography, SPIE—The International Society for Optical Engineering, Bellingham Wash., 2001.

The image on the wafer is then utilized in the process of creating within a semiconductor device. These processes are generally repeated multiple times creating layers of the fine circuitry at each die spot on the wafer. Alignment of these layers can be critical to the performance of the devices. Alignment errors of several nm can sometimes be sufficient to render a device useless or severely limit its performance.

Chip-making processes have been speeded up through the use of advanced photolithography lasers such as those sold by Cymer, Inc. of San Diego, Calif., chip throughput requirements have also increased. One consequence of the increased requirements has been the need for much faster and more accurate positioning of photolithography stages. Faster positioning has created the need for more precise control of the movement and positioning of stages.

Active vibration and motion control provides one promising method of achieving adequate system governance. Active control is often an ideal technology for dealing with vibration and motion control issues for a number of reasons, such as those discussed in commonly-owned U.S. patent application Ser. Nos. 09/491,969 and 10/074,059, which are hereby incorporated by reference. However, unknowns in plant dynamics and unforeseen disturbances to the system being controlled can significantly alter the actual results attained through active structural control, especially when used with sensitive machines such as semiconductor capital equipment. In this context, disturbances can manifest themselves in a variety of ways, such as affecting the signals input to the system being controlled, causing variances in sensor signals or by impacting performance variables. In addition, uncertainty in base or stage dynamics, and the impact upon those dynamics caused by changes in equipment configuration, mass distribution, and aging of equipment, subsystems, or components, all may serve to limit the performance of any standard control method chosen.

Systems implemented in many manufacturing system to control the motion of various components of subsystems are often referred to as servo control systems. These systems incorporate various actuators and sensors to monitor and command a prescribed motion of the subsystem. In many such systems implementing high precision control there is a need to apply structural control in order to eliminate performance degrading vibration. The structural control system may incorporate additional actuators and sensors into the system and may use feedback control to damp out unwanted vibrations. These additional actuators and sensors add to the cost, design and operational complexity of manufacturing equipment.

What is needed is a better motion control system.

SUMMARY OF THE INVENTION

The present invention provides a motion control system for reducing vibration in moving components. The system includes a position control drive and a vibration control drive. At least one position sensor is used to provide feedback signals which are in turn used to provide control signals for both the position control drive and the vibration control drive. In a preferred embodiment the motion control system is applied to a stage of an integrated circuit lithography step and scan machine. The position control drives are linear magnetic actuators and the vibration control drives are electroceramic actuators. A laser interferometer position monitoring system is used to measure the position, speed, and acceleration of the stage system. Actuators apply controlled forces (based on measurements from the position monitoring system) to each stage to control the motion of the stage. Signals from the interferometer position system are also used to control vibration. A recursive least squares (RLS) method is used to identify the commanded motion from the laser interferometer signals. Vibration measurements are derived from the laser interferometer signals by removing the commanded motion portion of the signal.

A computer processor is programmed with a feedback control algorithm developed using a linear quadratic regulator approach or classical control methods. The vibration measurements derived from the interferometer signals are used by the processor to provide feedback signals to the vibration control system to reduce vibration in the stage. The feedback signals drive a vibration control drive that in turn apply controlled forces to the stage control to minimize vibration. In preferred embodiments the vibration control drive is an electroceramic actuator.

DETAILED DESCRIPTION OF PREFERRED EMBODIMENTS

Figure 1:
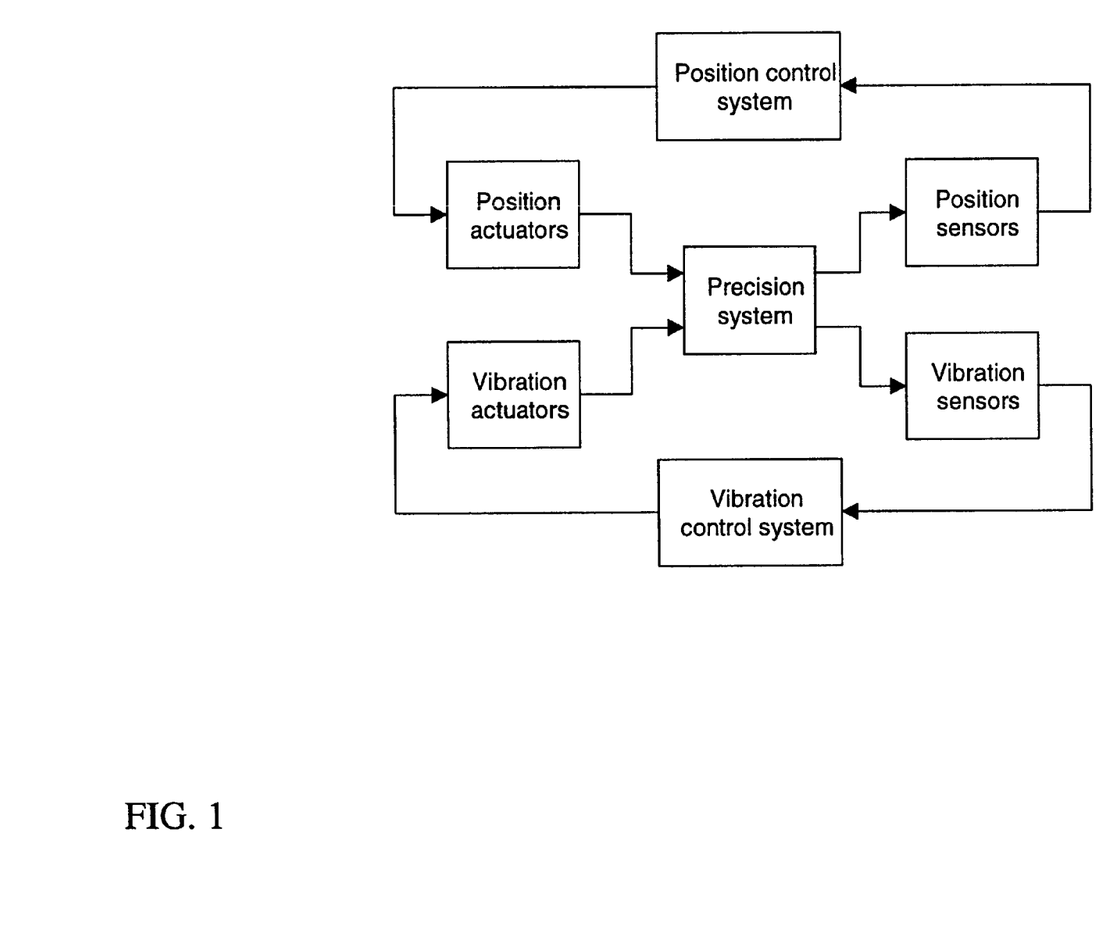
FIG. 1 illustrates a block diagram of a conventional structural control system in parallel with a position control system.
Figure 2:
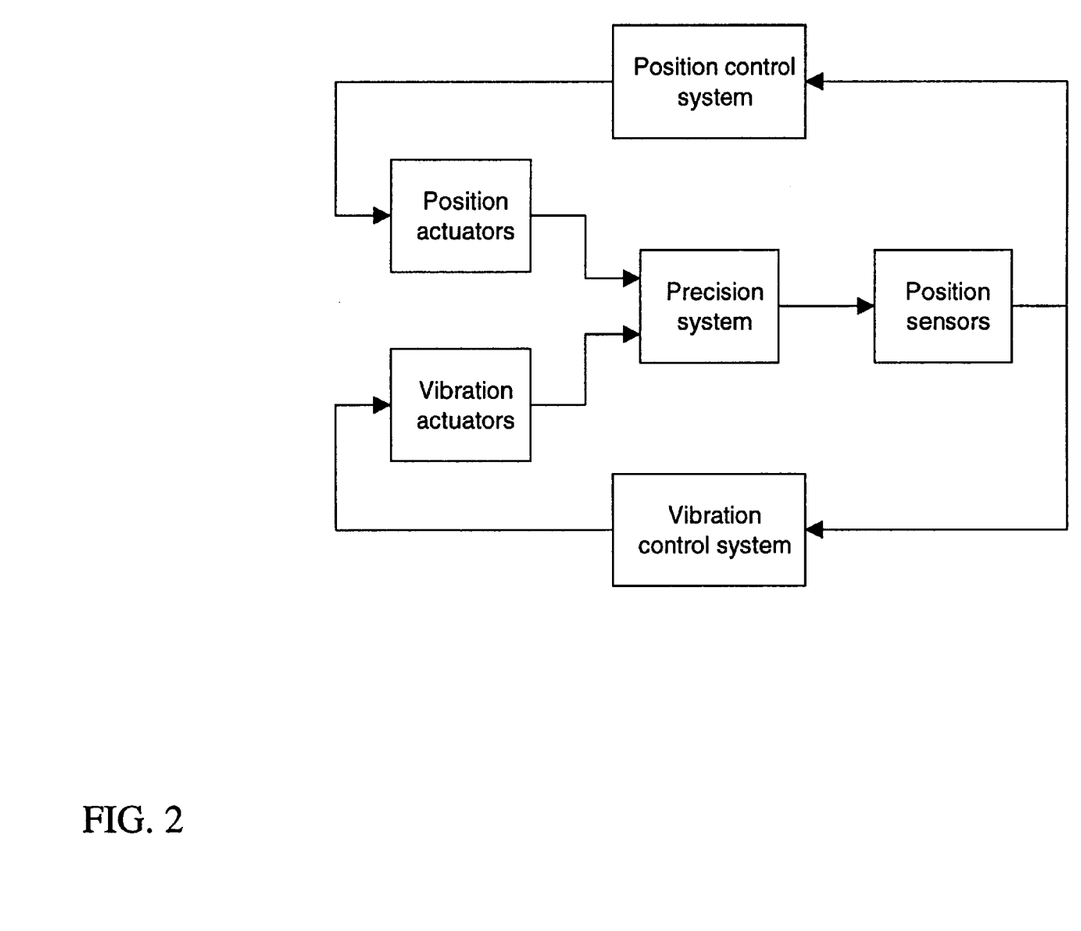
FIG. 2 illustrates a block diagram for a vibration control system in which position control sensors are utilized for the position and vibration control systems.

FIG. 1 illustrates a block diagram for a vibration control system that operates in parallel with a servo control system. FIG. 2 illustrates a block diagram for an alternative approach in which the position control sensors are used to control the position, speed, and acceleration of the moving system and to reduce vibration in the structure (e.g. structural control) of the moving system. The latter approach offers several key advantages:

1. It eliminates one entire set of sensors, thus reducing system cost and complexity.
2. The position control sensors are guaranteed to not pick up vibration appearing outside the position control loop. This eliminates the possibility of the position control sensors detecting vibration which does not degrade system performance.
3. Making the position control sensor signals directly available to the vibration control loop allows the vibration control loop to monitor its own impact on system performance.

To employ a position control sensor for vibration control, it is necessary to somehow remove all but the vibratory component of the signal for feedback. The vibration control system is tasked with reducing the vibratory component of the signal without adversely affecting the performance of the position control system or the operation of the precision equipment. For example, one form of applying vibration control occurs in robotics applications where the goal is to move a robotic arm to a prescribed location with a minimum of vibrations. The vibration of the robotic arm during motion of the robot may be unimportant. However, vibration control is needed after the robot arrives at it's final position to ensure that the payload of the arm is located in a precise location. Frequently, the vibration is highly observable through the robots encoders or other position sensors. However, there is also a very high component present in the signal from these sensors which represents the commanded position of the robot arm. This signal can be many order of magnitude larger than the amplitude of the vibration to be controlled. Therefore, prior to using the signal from the sensor in a feedback control system to reduce vibration, the component of the signal representing the control signal must be removed. The methods discussed utilize, in part, an RLS algorithm to determine the trend in the command signals which then allows the system to remove this trend thereby exposing the vibratory nature of the signal, we call this "detrending."

A useful application of the present invention is to control vibration in moving wafer and/or reticle stages of step and scan lithography machines. Frequently, interferometric metrology is used to precisely measure and control the position of the wafer and reticle stages. Undesired structural vibration can often be seen in these signals, but before the metrology system can be used as a feedback sensor for vibration reduction, it is necessary to remove the commanded component of motion (e.g. scan motion while illuminating a wafer). In this scenario the commanded component of motion is not simply an offset as in the previous example, but also includes a very large amplitude ramp. In this example the ramp may represent a constant velocity scanning motion commanded of the wafer stage. Additional examples are contemplated where the commanded component of motion includes higher order polynomials or other complex functions that describe a motion profile.

Figure 3:
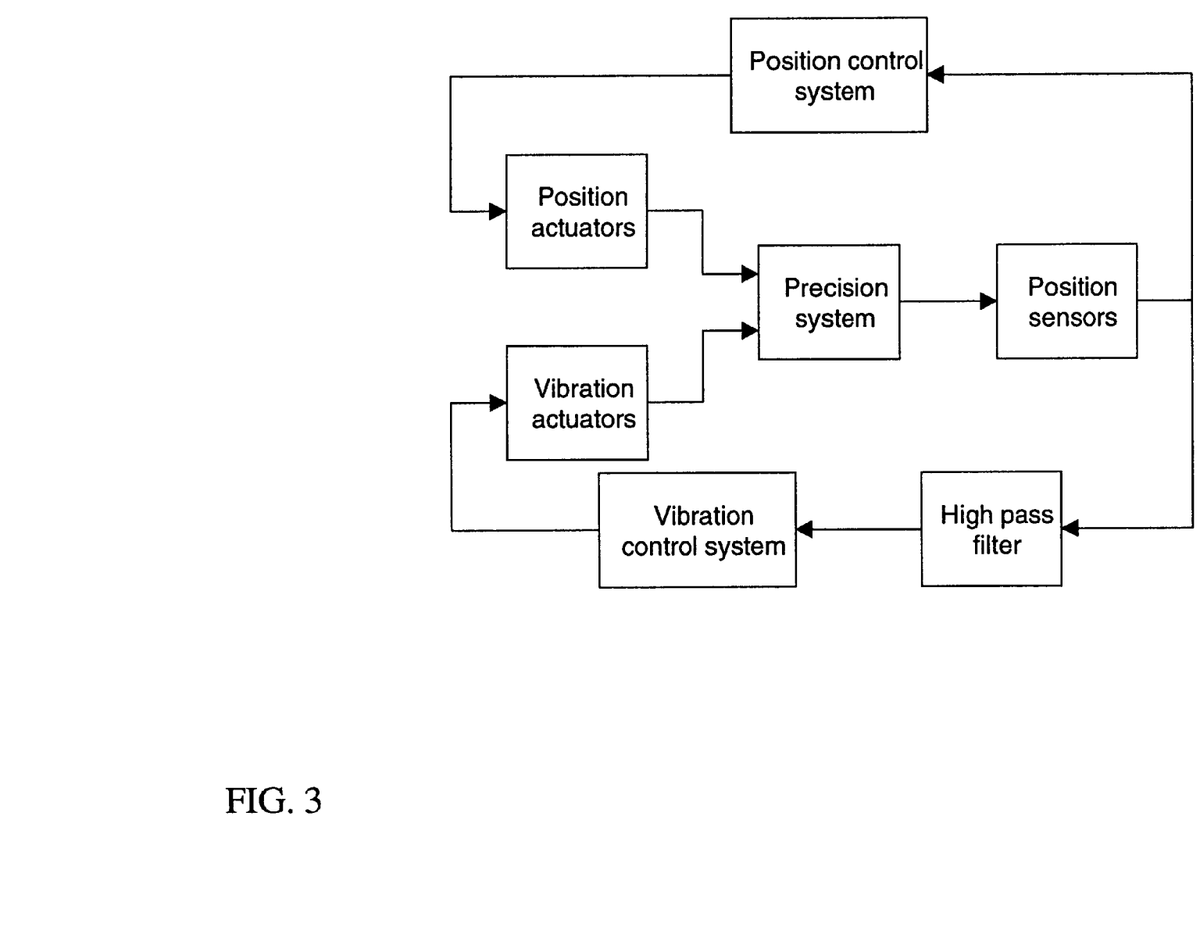
FIG. 3 illustrates a block diagram in which a high pass filter is used to remove the commanded portion of a position signal.

In order to filter out the controlled portion of a signal, one might wish to take advantage of the fact that the undesired vibratory motion occurs at a higher frequency than the commanded motion. FIG. 3 illustrates a method for stripping out the lower frequency portion of the signal by applying a high pass filter to the servo signal prior to the structural controller. This approach is limited, however, because in order to be useful, the filter must be able to remove the low frequency component quickly if it is to be useful. This can force the poles of the high pass filter to be at such a high frequency, that the vibratory component of the signal would be filtered out as well, or unacceptable phase shifts would appear in the loop transfer function of the servo control system. The effect of phase shifts would be to lower the speed at which scanning could accurately be performed.

Figure 4:
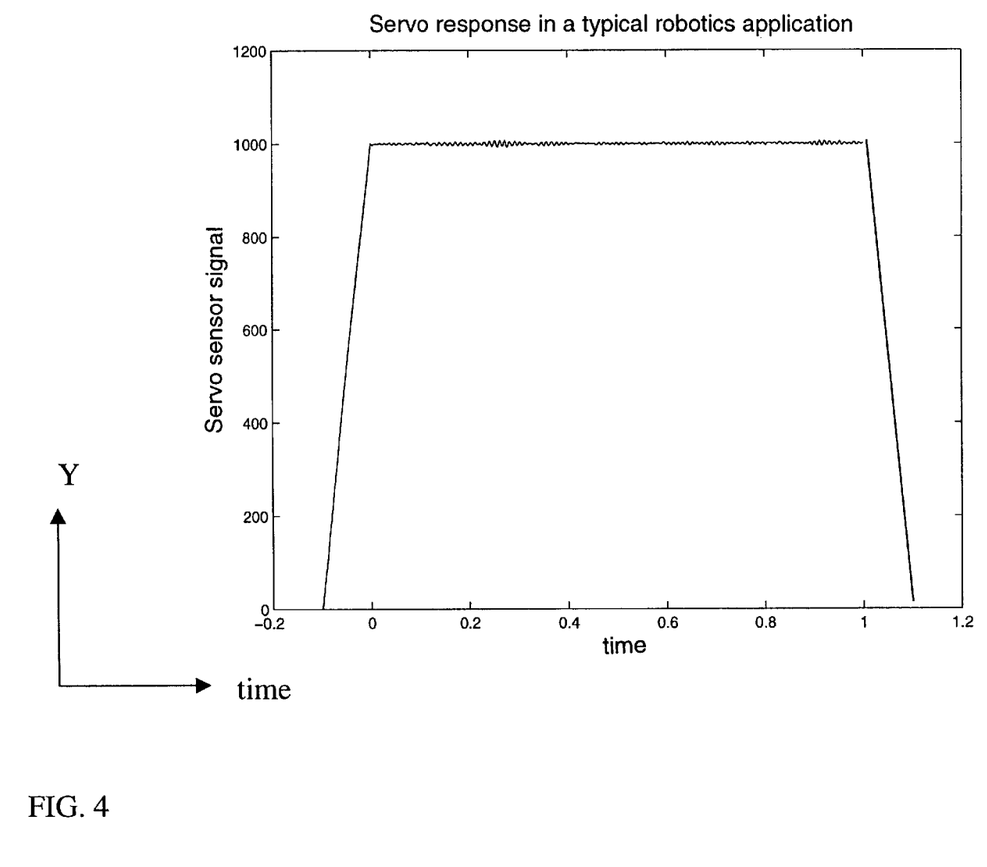
FIGS. 4 and 5 illustrates a signal measured by a position sensor in a robotic application.
Figure 5:
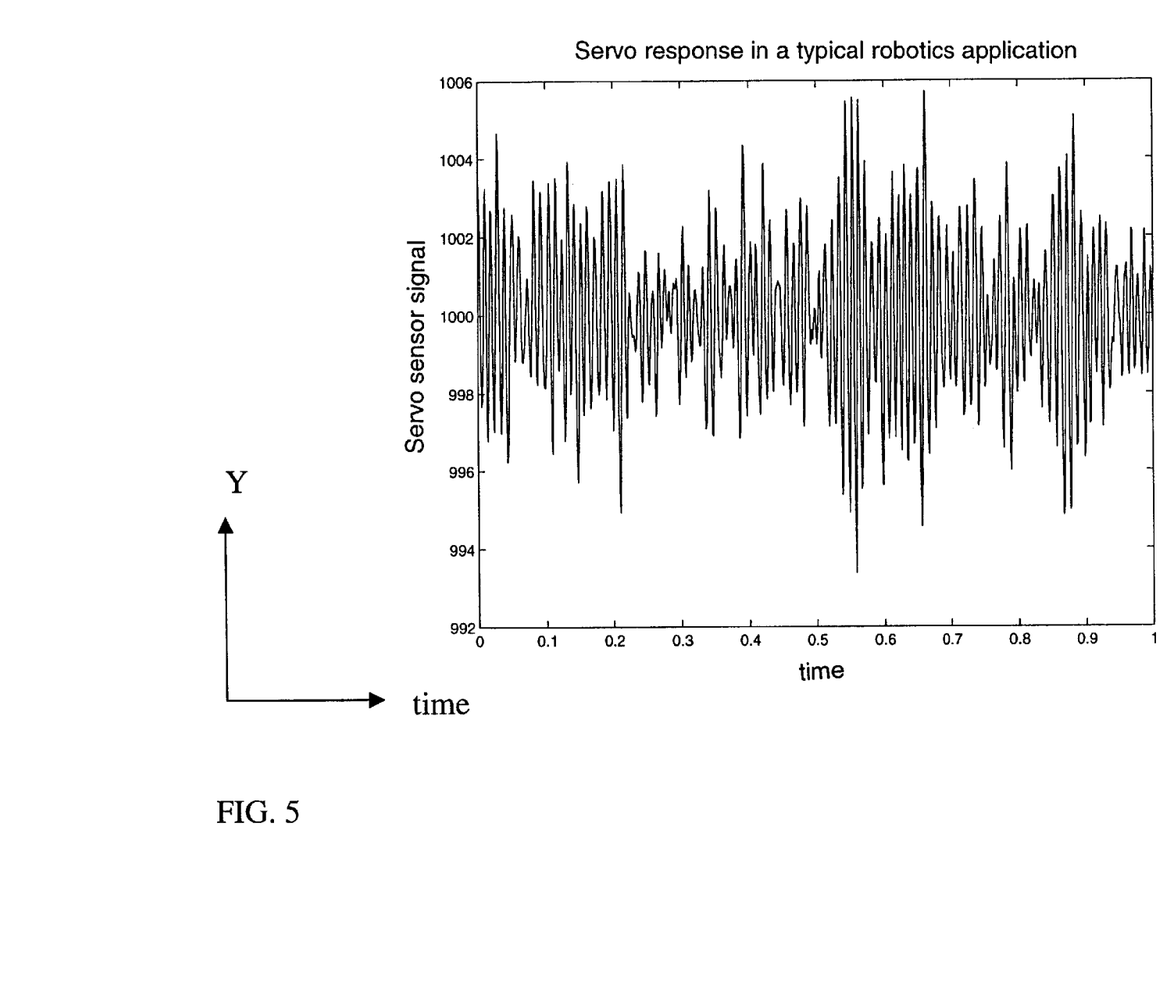

FIG. 4 shows a typical signal which would be seen in a position sensor in a robotics application in which the position control system is used to command the position of a robotic arm. The signal is representative of the position of the robotic arm in the Y-axis. Prior to time t=0 the position of the arm in the Y-axis is increasing from approximately 0 to 1000 units. At t=0 the stage achieves a position of 1000 units which it maintains until t=1 when it returns to its initial position of 0 units. FIG. 5 shows a closeup of the signal between t=0 and t=1. There is a vibratory component to the signal several orders of magnitude less than the commanded position. This is shown as excursions of approximately plus and minus six units centered around 1000 units in the Y-axis.

Figure 6:
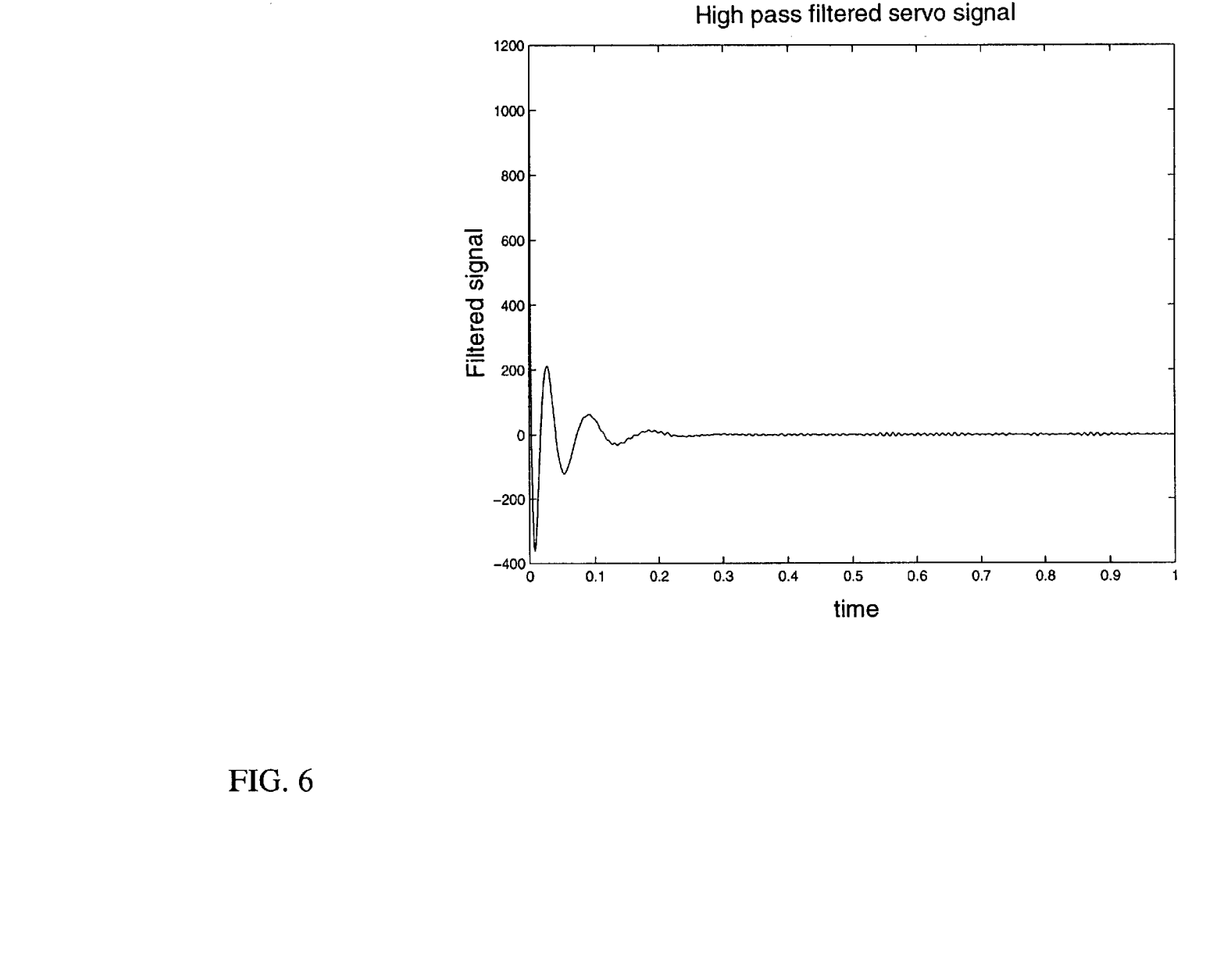
FIGS. 6 and 7 illustrates the transient response in a position sensor signal filtered through a linear high pass filter.
Figure 7:
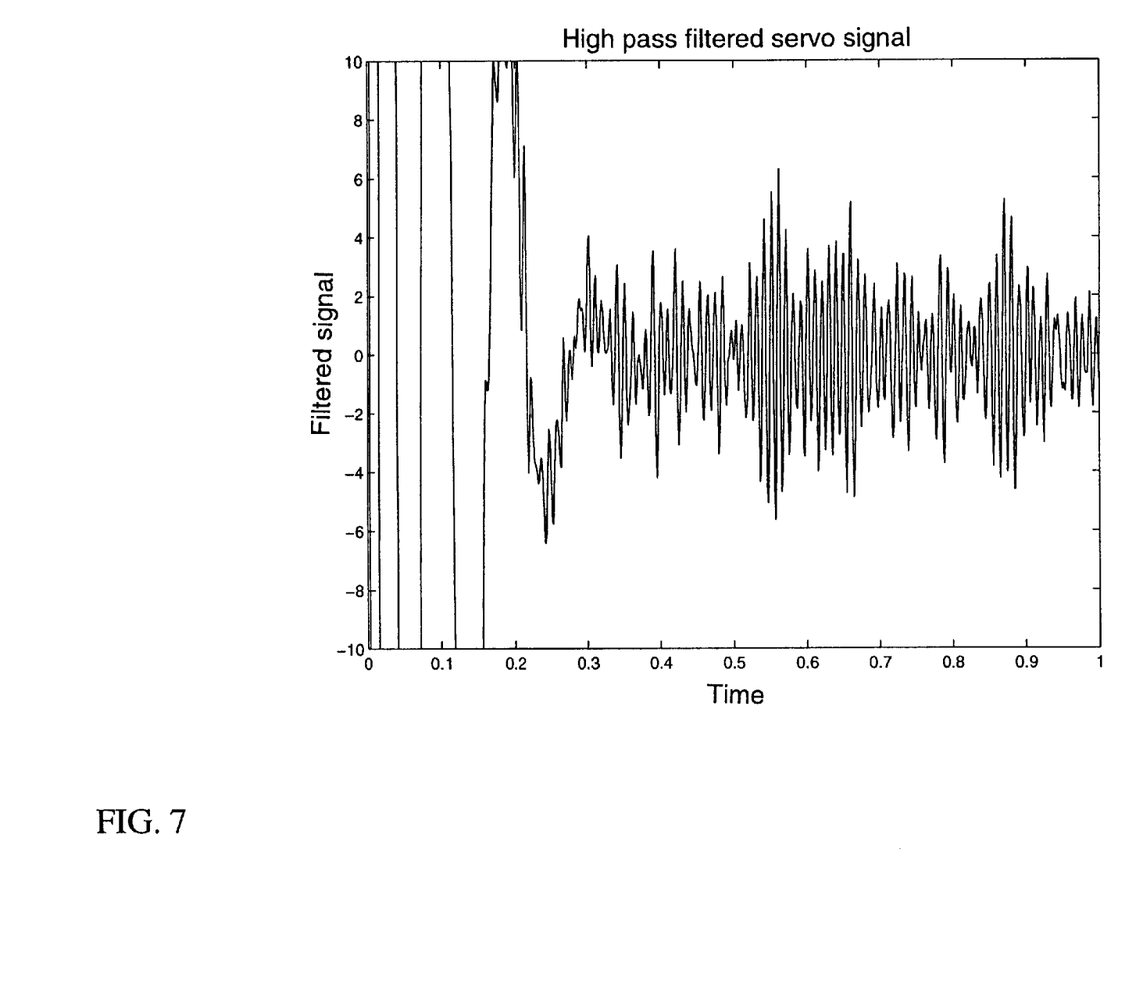

Application of a linear high pass filter to this signal will result in a response similar to that shown in FIGS. 6 and 7, respectively, in which the data are plotted with expanded ordinate. These plots show a high frequency component and a more slowly varying component. Eventually, the slowly varying component of the signal has been removed, but it has taken many cycles of the vibration to do so. FIG. 7 shows that after 0.3 units on the time scale axis (x-axis) the sensor signal is within plus and minus 6 y-axis units and thereafter represents the vibratory nature of the servo sensor signal that we would like to minimize using a vibration control system. This time delay could pose an unacceptable increase in the overall system throughput. The time delay of 0.3 x-axis time units detrimentally affects its use as a vibration reduction sensor until the signal value is below a threshhold value (plus and minus six y-axis units in this example).

Figure 8:
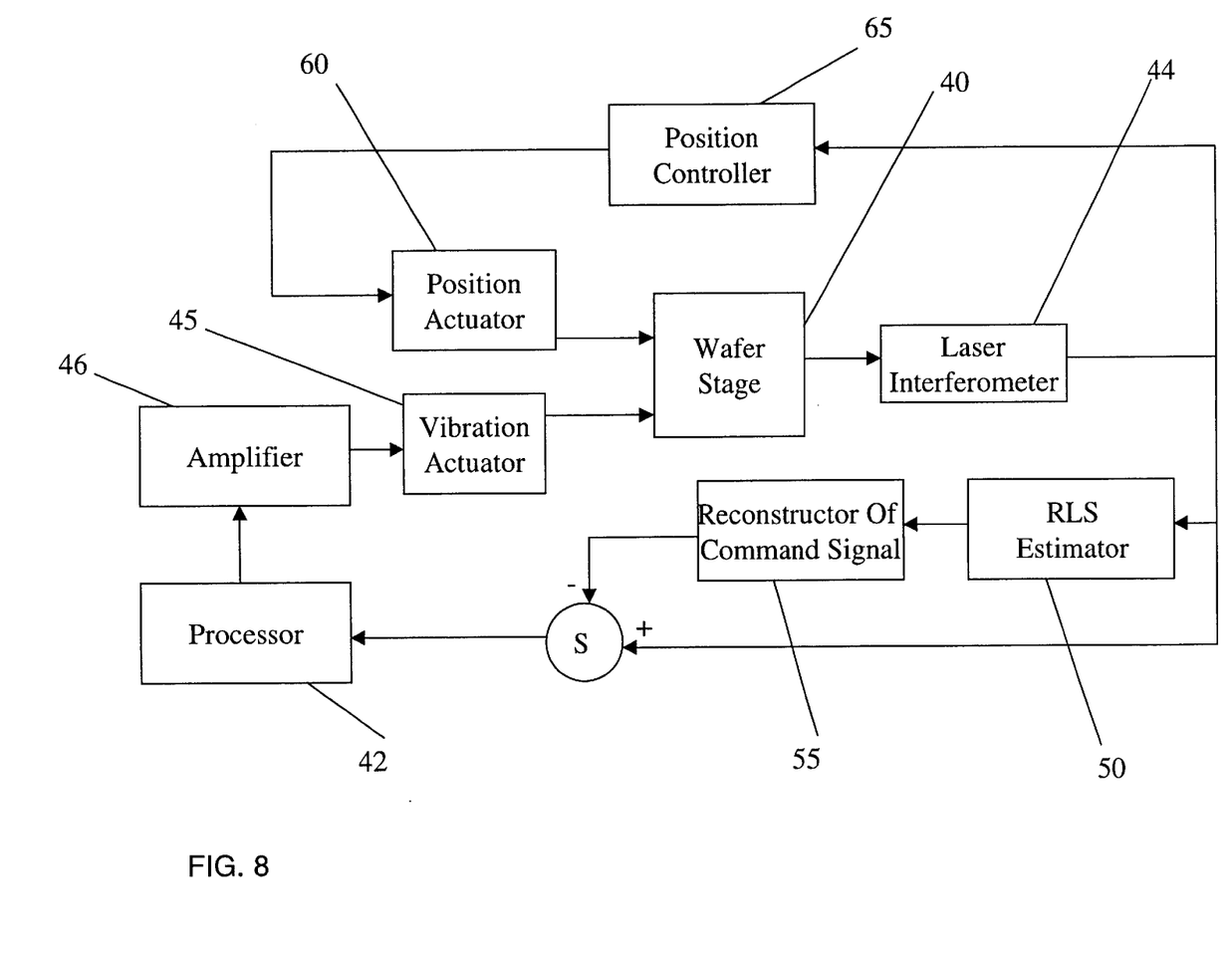
FIG. 8 illustrates a block diagram of an estimator used to obtain the vibratory signal from a position sensor signal.

The innovation described here is a method for quickly removing the commanded component of motion from signals from position sensors prior to vibration control. A block diagram illistrating this concept is shown in FIG. 8. The innovation has three primary parts: an algorithm for quickly removing commanded signals of known structure, implementing the algorithm with low computational overhead, and using the algorithm to reduce vibration.

Algorithm Description

The algorithm is based on a recursive least squares (RLS) method to estimate key parameters describing the commanded motion component of the signal from the position sensor. The first step in the algorithm is to parameterize a description of the commanded portion of the signal from the position sensor. The parameterization makes use of the fact that the commanded signal will have known structure. For example, in the robotics example described above, the designer knows that the commanded input is a constant after the robot completes its motion. The commanded portion of the servo signal can therefore be parameterized (other parameterizations such as periodic commands are also possible) as:

$$y_c(t) = y_{c0} \qquad (1)$$

In the lithography example described above, the commanded portion of the servo signal is a ramp with unknown offset and slope of the form:

$$y_c(t) = y_{c0} + y_{c1} t \qquad (2)$$

The algorithm estimates the scalar parameters describing the commanded signal in real time and subtracts the commanded signal from the position signal to obtain the vibratory component.

Algorithm Implementation

Figure 12:
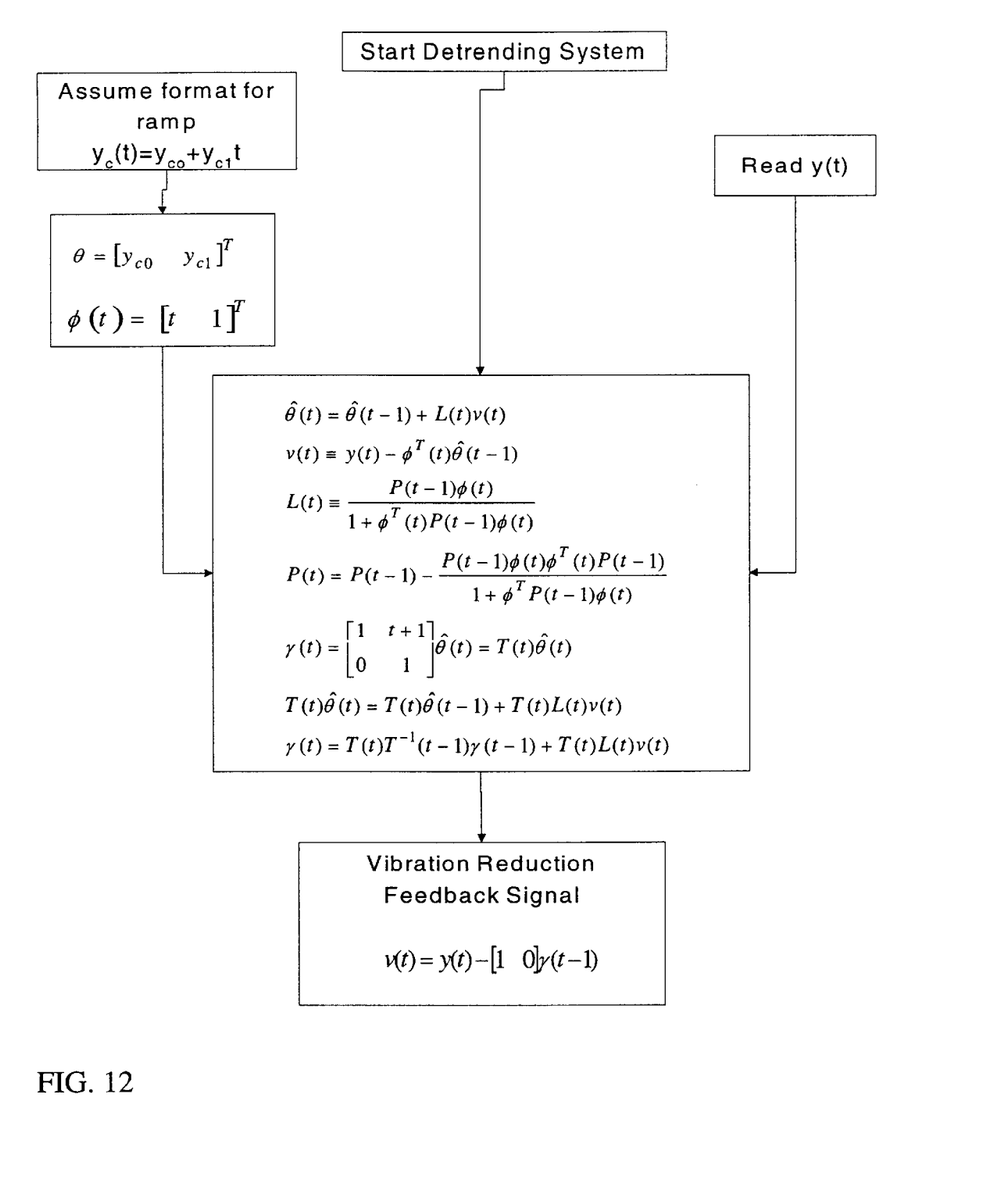
FIG. 12 illustrates a flow chart of the implementation of the detrender.

The RLS algorithm is preferably implemented as follows and as illustrated in FIG. 12 by a corresponding flowchart. Assume that the commanded portion of the servo sensor signal is given as:

$$y_c(t) = \phi^T(t)\theta \qquad (3)$$

where $\theta$ is a vector of parameters describing the commanded signal and $\phi(t)$ is a vector which when multiplied by $\theta$ yields the commanded portion of the signal $y_c(t)$. The RLS algorithm estimates the elements in $\theta$ in real time given the measurements, $y(t)$. For the example given in Equation 1, $\theta = y_{c0}$ and $\phi(t) = 1$. For the example in Equation 2, $\theta = [y_{c1}, y_{c0}]^T$. At every sample, the estimate of the parameter vector theta is given by (see L. Ljung, *System Identification: Theory for the User*, Prentice Hall, N.J., 1987.):

$$\hat{\theta}(t) = \hat{\theta}(t-1) + L(t)v(t) \qquad (4)$$

$$v(t) \equiv y(t) - \phi^T(t)\hat{\theta}(t-1)$$

$$L(t) \equiv \frac{P(t-1)\phi(t)}{1 + \phi^T(t)P(t-1)\phi(t)}$$

$$P(t) = P(t-1) - \frac{P(t-1)\phi(t)\phi^T(t)P(t-1)}{1 + \phi^T(t)P(t-1)\phi(t)}$$

where P(t) is an n×n matrix (n being the number of parameters in $\theta$), and $\hat{\theta}(t)$ is the parameter estimate. A close examination of Equation 4, shows that the computations take $3n^2 + 5n$ additions and subtractions and one division. Depending on the algorithm used, the single floating point division required will take approximately an additional 40 cycles.

It can be shown through a change of variables, that the recursive least squares algorithm shown above is in fact a time varying linear filter. The derivation is performed here for the case of a ramp command, but similar results apply for the general case. First, define a new state $\gamma(t)$.

$$\gamma(t) \equiv \begin{bmatrix} 1 & t+1 \\ 0 & 1 \end{bmatrix} \hat{\theta}(t) = T(t)\hat{\theta}(t) \qquad (5)$$

Multiplying the update law for $\hat{\theta}(t)$ by the matrix T(t):

$$T(t)\hat{\theta}(t) = T(t)\hat{\theta}(t-1) + T(t)L(t)v(t)$$

$$\gamma(t) = T(t)T^{-1}(t-1)\gamma(t-1) + T(t)L(t)v(t) \qquad (6)$$

The vibratory component of the signal, v(t) can be written:

$$v(t) = y(t) - [1\ 0]\gamma(t-1) = y(t) - C\gamma(t-1) \qquad (7)$$

Substituting into Equation 6:

$$\gamma(t) = T(t)T^{-1}(t)\gamma(t-1) + T(t)L(t)(y(t) - C\gamma(t-1))$$

$$\gamma t(t) = (T(t)T^{-1}(t) - T(t)L(t)C)\gamma(t-1) + T(t)L(t)y(t) \qquad (8)$$

Equations 8 and 7 together describe a time varying linear filter of order, n, which maps the measurements into the detrended output. The filter coefficients for a finite time interval can be computed a priori to operation and stored in RAM. In order to save memory, it is possible to save the filter coefficients for a relatively short time interval. When the end of the table is reached, the coefficients for the last filter in the table are repeated until the machine begins a new move and the vibration control system is turned off. The effect of this is that the algorithm becomes a linear time invariant high pass filter. The pole frequencies of the filter can be adjusted by changing the length of the gain schedule.

Detrending in a Wafer Stage

FIG. 8 illustrates one embodiment of a structural control system that could be used to reduce vibrations in a wafer stage 40. In this case the position sensor is a laser interferometer system 44 as manufactured by Agilent Technologies with offices in Santa Clara, Calif. This system comprises a plurality of components including a laser head, interferometers, receivers, and beam splitters, see *Laser and Optics Users Manual*, Hewlett-Packard Company, March, 1996. In this embodiment, laser interferometer system 44 sends a position measurement to RLS estimator 50. RLS estimator 50 estimates the commanded motion from the velocity signal and then sends the estimate to module 55. Module 55 reconstructs the commanded signal from the estimate. The difference between the signal from the laser interferometer system and the signal generated by module 55 is calculated and then sent to processor 42. Position actuators 60 are controlled by position control controller 65 in response to feedback sensor signals provided by laser interferometer system 44. Processor 42 might be Model micro-line® C6711CPU supplied by Orsys Orth System GMBH with offices in Markdorf, Germany. This processor is a high performance digital signal processor single board computer featuring analog input and output capability. The processor is used to implement a feedback control algorithm for reducing vibrations in the wafer stage 40. Active feedback control is often an ideal technology for dealing with vibration control issues for a number of reasons, such as those discussed in commonly-owned U.S. patent application Ser. Nos. 09/491,969 and 10/074,059, which are hereby incorporated by reference. The processor 42 sends a command signal to amplifier 46 that subsequently sends an electrically amplified command signal to a structural actuator 45 to reduce the vibrations in the wafer stage. The feedback control algorithm preferably is designed using a standard linear quadratic regulator approach, ensuring that the motor control signals do not exceed the motor or motor amplifier limits.

Figure 9:
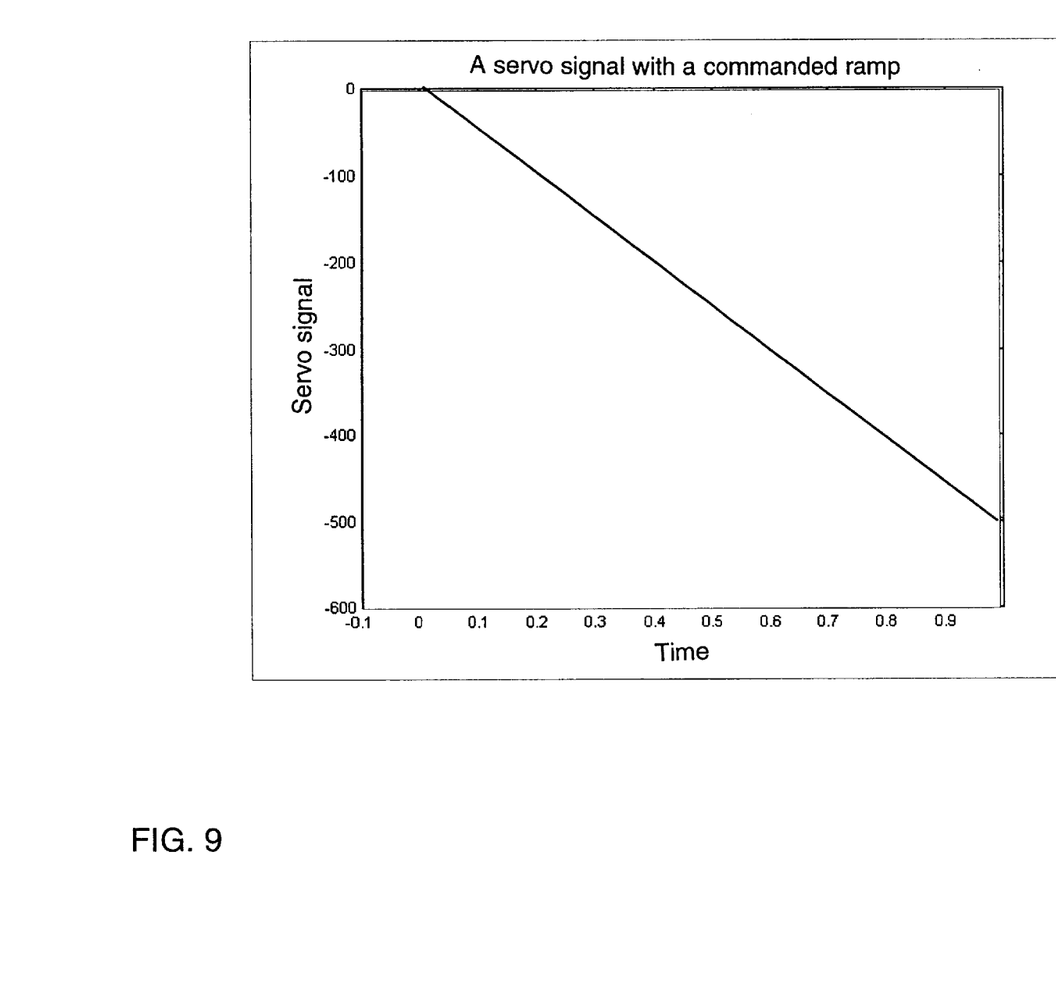
FIG. 9 shows a plot of an ideal position signal for a commanded ramp.
Figure 10:
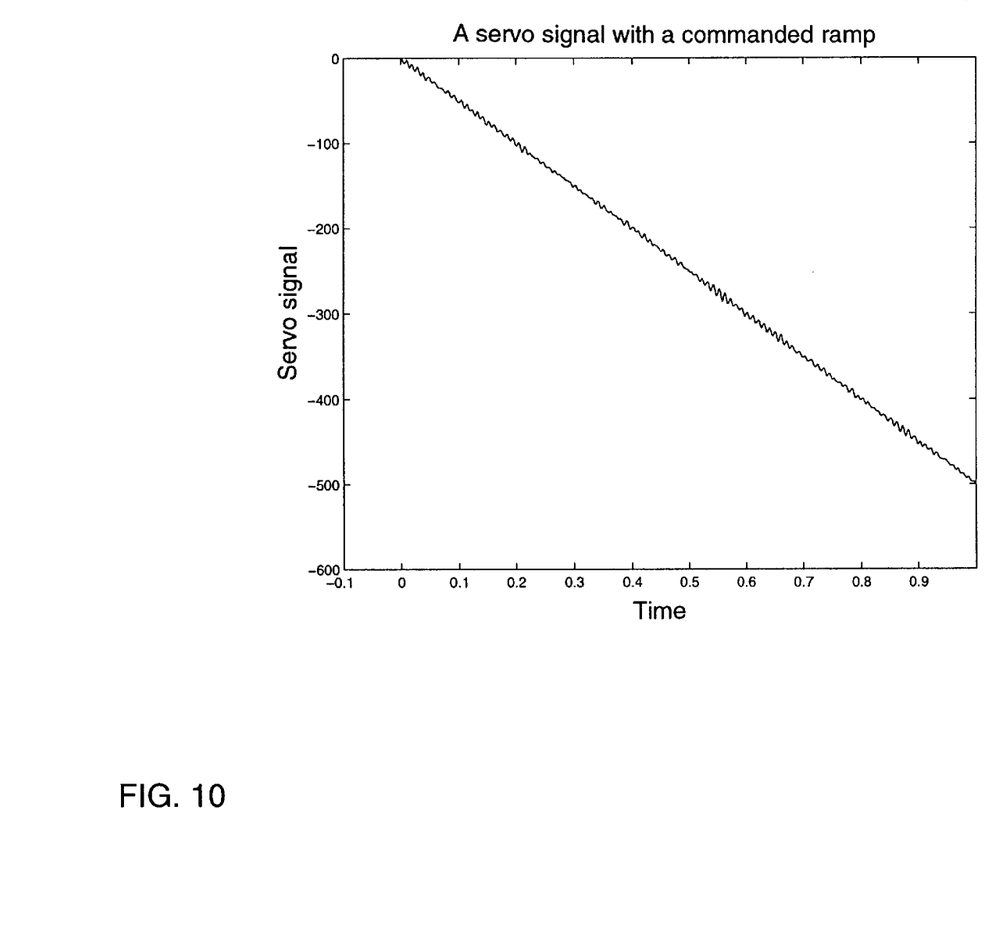
FIG. 10 shows a plot of a position signal for a commanded ramp with a low amplitude vibratory oscillation in the signal.

Control design is accomplished by Applicants by first creating a state-space plant model from transfer function data using the Smart ID™ system identification software package commercially available from Active Control Experts, Inc. with offices in Cambridge, Mass. (see commonly-owned U.S. patent application Ser. No. 09/896,689 which is incorporated herein by reference). The feedback control algorithm was then designed through computer simulation and application of techniques discussed in Fanson and *The Control Handbook, William S. Levine, Editor, CRC Press,* 1996. Various control design techniques can be used to design the algorithm, including, a linear quadratic regulator approach or classical control methods. To produce a detrended signal the commanded signal is subtracted from the position control signal. The detrended signal is used as a feedback measurement for purposes of reducing the oscillation. Success is achieved when the position measurement signal shows that the actual stage position as a function of time corresponds to the desired response. FIGS. 9 shows the preferred position of a wafer stage as a function of time if no vibrations are present in the wafer stage. However, in the presence of structural vibrations in the stage the plot of the position versus time would contain oscillations as illustrated in FIG. 10. The oscillations are observed as +/−5 unit excursions from a straight line from t=0 to t=1. In FIGS. 9 and 10 the beginning of the ramp move (prior to time t=0) and at the end of the ramp move (after time t=1.0) have been eliminated so that oscillations due to starting and stopping the ramp motion do not need to considered in this example. However, the techniques described herein could be equally well applied if the oscillations were considered.

Figure 11:
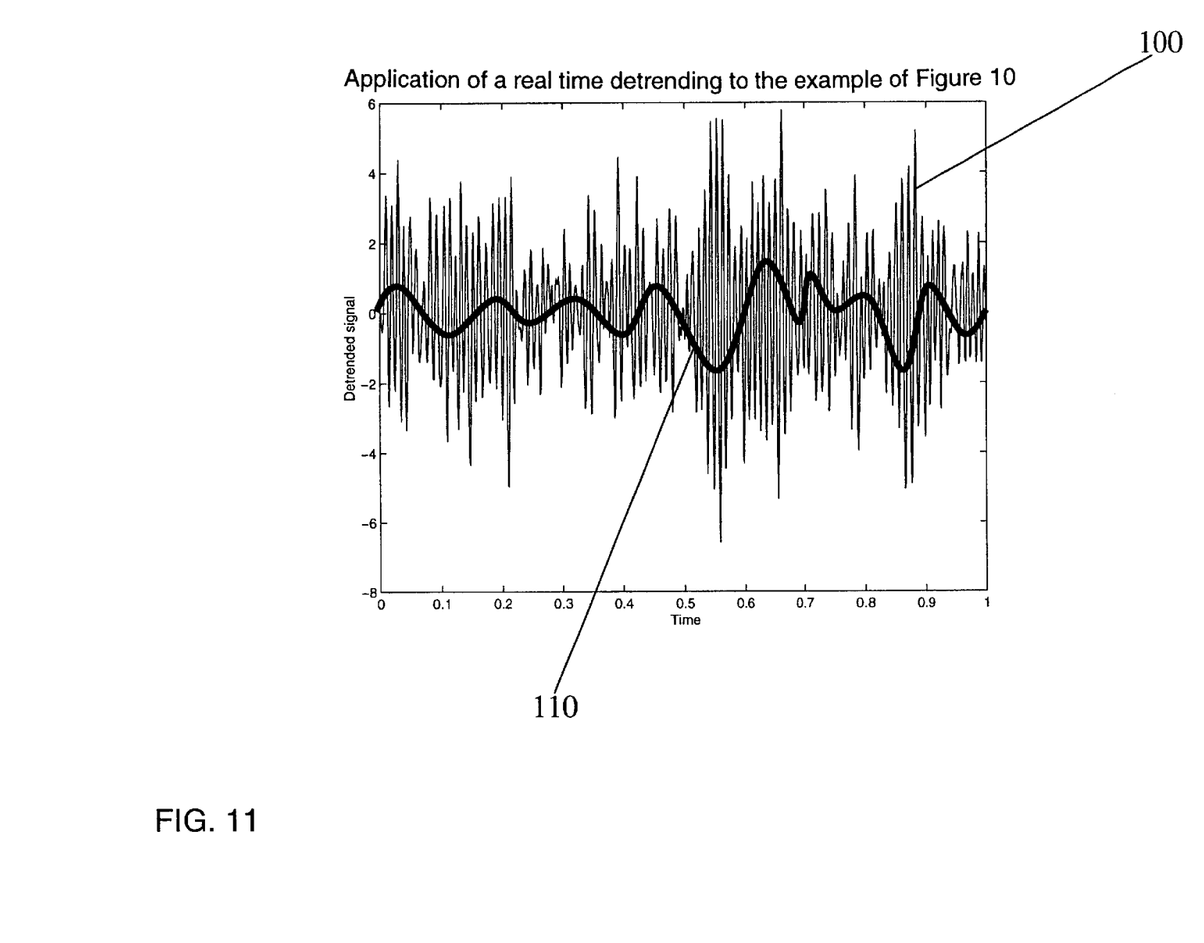
FIG. 11 illustrates results of applying a detrender to a position control sensor signal that is commanding the position control system to perform a ramp commanded motion and the results of using the detrended measurement in a feedback control system.

In this embodiment, the moving portion of the wafer stage for a lithography system typically weighs on the order of 140 kg. Linear magnetic actuators or voice coils would typically be used to move (scan) the wafer relative to the mask. In modem lithography systems the scanning distance (during which illumination of the reticle and subsequently the wafer is conducted) is approximately 300 mm (corresponding to the size of the wafer). However, this detrending method and system will work equally well with smaller systems in which the motors and masses are correspondingly smaller. One would anticipate the system and methods to function with masses as least as small as tens of grams and as least as large as thousands of kilograms. It is also anticipated that this approach would work equally well in a disk drive application where it may be desirable to reduce vibrations in a disk drive suspensions as the disk drive head scans a hard drive of a computer to read or write data. Equation 2 describes the commanded portion of the servo signal (a ramp of unknown offset and slope) for the wafer stage example. Application of the detrending method described in FIG. 8 to the wafer stage would yield a vibratory signal as illustrated by measurement 100 in FIG. 11. Application of feedback control methods described and referenced above to this wafer stage would have the effect of damping the oscillations observed in the position measurement as illustrated by measurement 110.

Equivalents

While the invention has been particularly shown and described with reference to specific preferred embodiments, it should be understood by those skilled in the art that various changes in form and detail may be made therein without departing from the spirit and scope of the invention as defined by the appended claims. Possible variations include:

1) multiple axes (x, y, z and rotations around x, y, z) are controlled using one controller.
2) performance of the system can be optimized for a variety of servo motions (step, scan, motion in multiple planes, parabolic motion).
3) the position sensor could be any of a variety of well known position sensors other than interferometer systems such as a capacitive gap sensor.
4) position sensors include sensors which measure derivatives of displacement such as: accelerometers, velocity sensors.
5) many drives (in addition to voice coils, linear magnetic actuators and electroceramic actuators) can be used.
6) this invention could be applied to many types of equipment in addition to the lithography equipment referred to above such as: equipment (metrology and inspection, pick and place, optical component manufacturing, etc.).
7) the vibration reduction feedback controller may be any SISO or MIMO controller.

The MIMO controller is based upon Linear Quadratic Guassian (LQG) techniques, or mu-synthesis, or H-infinity techniques.

Accordingly, the reader is requested to determine the scope of the invention by the appended claims and their legal equivalents and not by the examples that have been given.

What is claimed is:

1. A vibration reduction system for reducing vibration of a motion controlled component, said vibration reduction system comprising:

A) at least one position control drive for moving said motion controlled component, B) at least one position sensor for providing a feedback position signals indicative of positions of said motion controlled component, C) at least one position control system for controlling positions of said motion controlled stage via said at least one position control drive utilizing said feedback signals from said at least one sensor, D) at least one vibration control drive, and E) a computer processor for controlling vibration said processor having been programmed with
  (1) a separation algorithm for separating vibration signals from said feedback position signals, and
  (2) a feedback control algorithm for commanding said vibration control drive to reduce vibrations in said motion controlled component.

2. The system as in claim 1 wherein the motion controlled component comprises a portion of a lithography machine.

3. The system as in claim 1 wherein said vibration control drive is an electroactive ceramic actuator.

4. The system as in claim 1 wherein said position control drive is a linear magnetic actuator.

5. The system as in claim 1 wherein said position control drive is a voice coil.

6. A system as in claim 1 wherein said position control drive is a linear motor.

7. The system as in claim 1 wherein said at least one sensor comprises a laser interferometer positioning system.

8. A system as in claim 1 wherein said feedback control algorithm incorporates a linear quadratic regulator solution.

9. A system as in claim 1 wherein said separation algorithm comprises an RLS method and a reconstruction method utilizing a linear quadratic regulator approach.

10. A system as in claim 1 wherein said position control system comprises a processor programmed to move said motion controlled component in a ramp.

11. A system as in claim 1 wherein at least one position sensor comprises an accelerometer.

* * * * *

UNITED STATES PATENT AND TRADEMARK OFFICE
CERTIFICATE OF CORRECTION

PATENT NO.         : 6,872,961 B2
APPLICATION NO. : 10/112443
DATED                 : March 29, 2005
INVENTOR(S)       : Jacques et al.

It is certified that error appears in the above-identified patent and that said Letters Patent is hereby corrected as shown below:

Column 1:
Line 53, after "process is" change to "sometimes"

Column 2:
Line 5, after "San Diego, Calif." start new sentence with "Chip"
Line 31, after "manufacturing" change to "systems"

Column 4:
Line 16, after "can be many" change to "orders"

Column 5:
Line 25, after "diagram" change to "illustrating"

Column 7:
Line 12, after "by position" delete "control"
Line 27, after "to a structural" insert --vibration--
Line 51, after "response" change to "FIG. 9"
Line 61, after "need to" insert --be--

Column 8:
Line 12, after "drive" change to "suspension"
Line 63, after "providing" delete "a"
Line 66, after "controlled" delete "stage" and insert -- component--

Signed and Sealed this

Twenty-second Day of August, 2006

JON W. DUDAS
*Director of the United States Patent and Trademark Office*